(12) United States Patent
Jiang et al.

(10) Patent No.: US 6,788,552 B1
(45) Date of Patent: Sep. 7, 2004

(54) METHOD AND APPARATUS FOR REDUCING SUBSTRATE BIAS VOLTAGE DROP

(75) Inventors: Tongbi Jiang, Boise, ID (US); Zhiqiang Wu, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 09/652,216

(22) Filed: Aug. 30, 2000

(51) Int. Cl.[7] .............................. H05K 9/00; H03K 3/01
(52) U.S. Cl. ...................... 361/818; 327/534
(58) Field of Search .................... 257/48, 402, 675, 257/689, 782, 783; 327/520, 534–537; 361/816, 818, 820

(56) References Cited

U.S. PATENT DOCUMENTS

| | | | | |
|---|---|---|---|---|
| 5,317,107 A | * | 5/1994 | Osorio ...................... 174/35 R |
| 5,753,958 A | * | 5/1998 | Burr et al. | |
| 5,773,328 A | * | 6/1998 | Blanchard ................... 438/162 |
| 5,981,318 A | * | 11/1999 | Blanchard ................... 438/162 |
| 6,048,746 A | * | 4/2000 | Burr | |
| 6,061,267 A | * | 5/2000 | Houston ..................... 365/154 |
| 6,064,116 A | * | 5/2000 | Akram ........................ 257/700 |
| 6,091,140 A | * | 7/2000 | Toh et al. | |
| 6,147,857 A | * | 11/2000 | Worley et al. | |
| 6,218,708 B1 | * | 4/2001 | Burr ........................... 257/372 |
| 6,406,938 B2 | * | 6/2002 | Rodenbeck et al. ........ 438/108 |
| 2002/0055246 A1 | * | 12/2001 | Jiang et al. ................. 438/597 |

OTHER PUBLICATIONS

Intel, 2000 Packaging Databook, posted on–line at http://search.intel.com Feb. 1, 2000, pp. 3–1 through 3–8.*
Intel, 1998 Packaging Databook, posted on–line at http://search.intel.com Jan. 31, 2000, p. 1 of Glossary.*
Shah et al., "Cyanate Ester Die Attach Material For Radiation Hardened Electronic Packages", 3rd International Conference on Adhesive Joining & Coating Technology in Electronic Manufacturing, Binghamton, NY, Sep. 1998., 6 pages.*
R.F. Graf, Modern Dictionary of Electronics, 7th Edition, 1999, Newnes, p. 53.*

* cited by examiner

*Primary Examiner*—Evan Pert
(74) *Attorney, Agent, or Firm*—Dickstein Shapiro Morin & Oshinsky LLP

(57) ABSTRACT

A semiconductor device is provided with a conductive layer provided on a backside of a semiconductor substrate. The conductive layer helps maintain a uniform bias voltage over the substrate. The conductive layer can also be used to apply a bias voltage to the substrate and reduce the number of bias voltage distribution regions required.

58 Claims, 6 Drawing Sheets

US 6,788,552 B1

METHOD AND APPARATUS FOR REDUCING SUBSTRATE BIAS VOLTAGE DROP

BACKGROUND OF THE INVENTION

The invention relates to semiconductor devices and more particularly to a method and apparatus for reducing bias voltage drops within a substrate.

DESCRIPTION OF THE RELATED ART

Semiconductor devices which perform various functions are constructed on semiconductor substrates using a variety of techniques. The integrated circuits are generally constructed on the upper, active surface of a substrate or semiconductor wafer. It is common to provide a substrate bias voltage Vbb via a plurality of well plugs, such as P-well plugs. The Vbb bias voltage is typically provided by a voltage regulator or a charge pump. The well plugs are electrically connected with the substrate through respective diffusion regions. The substrate bias voltage Vbb is used to control the threshold voltage Vt of various transistors formed in the substrate and maintain a substantively uniform Vt from transistor to transistor. If the substrate voltage Vbb differs across the area of the substrate due to voltage drops it changes the threshold voltage Vt characteristics of nearby transistors causing the transistors to switch inappropriately.

It is known in the art to maintain a stable substrate bias voltage Vbb over a large area of the substrate by spacing the well plugs close together, however this occupies large substrate real estate. It is also known to use a heavily doped substrate with a lightly doped epitaxial layer to help stabilize the substrate voltage; however such processes are expensive. It would be desirable to have a semiconductor device and method of making the same that cost effectively reduces bias voltage Vbb drop across the substrate, and which also reduces the number of P-well plugs required to supply the bias voltage Vbb over a given substrate area.

SUMMARY OF THE INVENTION

The invention provides a conductive layer secured to a backside of a semiconductor substrate to help maintain a more uniform level of bias voltage within the substrate. The substrate has transistors fabricated on its upper, active side and has P-well plugs on the upper, active side that electrically couple Vbb voltage from a Vbb voltage source to the substrate. The conductive layer can be a conductive metallic layer, a conductive paste, a conductive polymeric film, or a conductive metallic film and provides a path for removing unwanted voltage or noise from the substrate to help maintain a uniform Vbb voltage throughout the substrate. As a consequence, a more uniform bias voltage Vbb is provided within the substrate and in particular in the proximity of the transistors and thus the number of P-well plugs used to supply the Vbb voltage can be reduced. The backside conductive layer may optionally be directly connected to a Vbb bias source.

Different materials and methods are disclosed for forming and/or securing the conductive layer to the backside of the substrate. In one exemplary embodiment the conductive layer is a metallic layer, which may optionally extend beyond the backside of the substrate to provide an area for a wire bond connection to the Vbb bias source. In other exemplary embodiments the conductive layer may be formed as a cureable conductive paste, a conductive polymeric film, or a thin conductive metal film.

BRIEF DESCRIPTION OF THE DRAWINGS

These and other advantages and features of the invention will be more readily understood from the following detailed description of the invention which is provided in connection with the accompanying drawings.

DESCRIPTION OF PREFERRED EMBODIMENTS

The invention will now be described with reference to a substrate of a semiconductor device which is biased by a Vbb voltage, which may be obtained from a pumped voltage source. It is understood that the invention has broader applicability and may be used with a substrate of any pumped or non-pumped semiconductor device, including processors and memory devices with many different circuit and transistor configurations. Similarly, the process and resulting structure described below are merely exemplary of the invention, as many modifications and substitutions can be made without departing from the spirit or scope of the invention.

The term "substrate" used in the following description may include any semiconductor-based structure that has an exposed silicon surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

Figure 1:
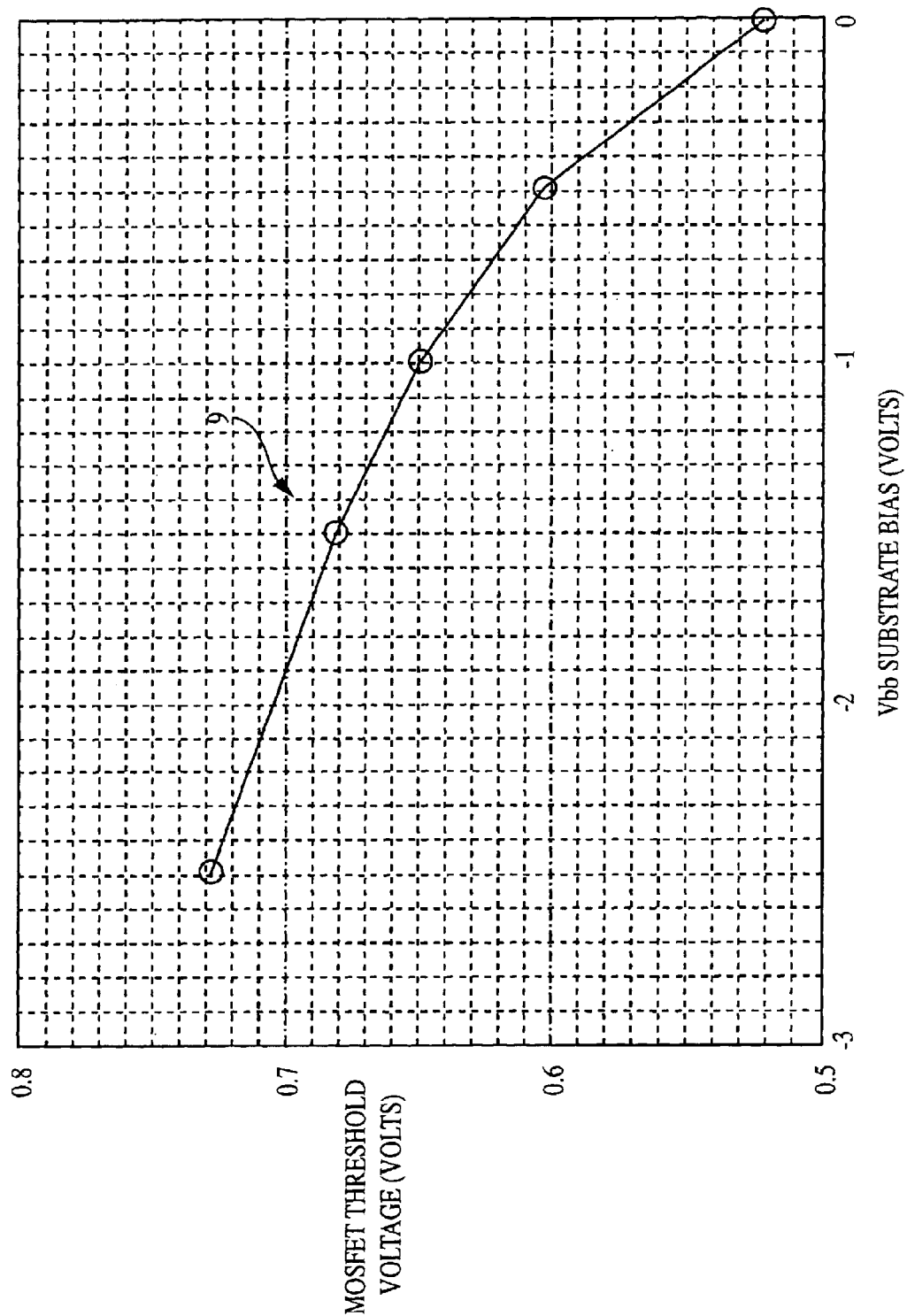
FIG. 1 is a graphical representation of a change in transistor threshold voltage Vt caused by variations in substrate bias voltage Vbb.

To help explain the invention a brief discussion of how the substrate bias voltage Vbb affects transistor operation is provided in connection with FIG. 1. It is a graphical representation 9 of the change in the threshold voltage Vt of a typical NMOS transistor fabricated in a substrate with variations in substrate bias voltage (Vbb). The x-axis is a measure of the bias voltage Vbb in volts and the y-axis measures the threshold voltage Vt of a transistor in volts. For FIG. 1 the transistor was designed to have a threshold voltage Vt of 0.65 Volts at a bias voltage Vbb of −1 volts. FIG. 1 demonstrates that as the bias voltage Vbb varies the transistor's threshold voltage Vt also varies. Accordingly, it is important to keep the Vbb bias voltage within a substrate as uniform as possible to avoid localized changes of transistor Vt which will affect transistor operation. However, variations in bias voltage Vbb occur due to unwanted voltage or electrical noise that develops within and along a substrate. Some of this voltage comes from device "cross talk" while some of the unwanted voltage or electrical noise is generated from the operation of the various transistors themselves. While FIG. 1 illustrates the impact of substrate voltage drop on a transistor, it is understood that the present invention relates to semiconductor electrical elements in general, such as transistors, resistors, capacitors, electrodes, amplifiers, inverters, and gates.

Figure 2:
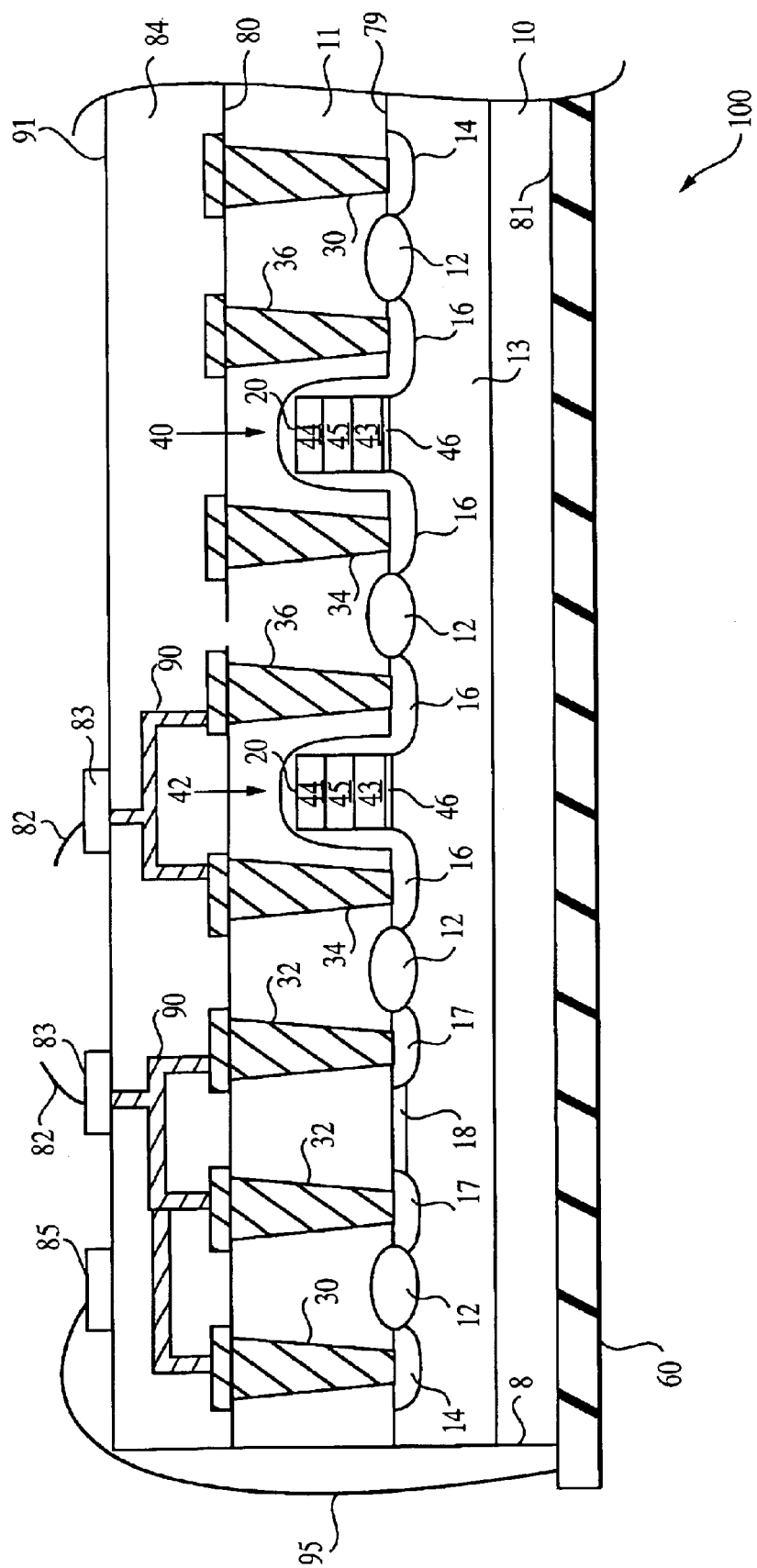
FIG. 2 is a side view of an integrated circuit semiconductor device which is fabricated in accordance with the invention.

Referring now to FIG. 2, is a partial elevation view of a semiconductor device 100 fabricated in accordance with the present invention. The present invention provides a conductive layer 60, such as a metallic layer, conductive paste, conductive polymeric film, or conductive metallic film, on the back side 81 of a semiconductor substrate 10 to maintain a more uniform bias voltage Vbb throughout substrate 10. The device 100 is shown with two exemplary MOSFET transistors 40, 42 constructed on substrate 10 which is formed of a semiconductor material with a P-well region 13, in the upper portion of substrate 10. Device 100 has top surface 91 and substrate upper surface 79 and backside 81. Conductive layer 60 is shown attached to the backside 81. Conductive layer 60 may be a metallic layer (first embodiment), a conductive paste (second embodiment), a conductive polymeric film (third embodiment), or a conductive metallic film (fourth embodiment). FIG. 2 shows conductive layer 60 formed as a metallic layer. Wire bond 95 is shown connecting conductive layer 60 with bonding pad 85. Bonding pad 85 may be in electrical contact with bias voltage Vbb source 92 and discussed with respect to FIGS. 3.

The FIG. 2 device 100 is merely exemplary of a typical solid state semiconductor circuit which could be configured in numerous ways. Various transistors 40, 42, P-well plug diffusion regions 14, field oxide regions 12, source/drain regions 16, and resistors 18 may be formed on the upper surface 79 of the substrate 10 or in P-well 13. The transistors 40, 42 are shown formed on gate oxide region 46, with a silicide layer 45, gate electrode 43, and a dielectric cap layer 44. The gate stacks 40, 42 are covered with a gate stack insulating layer or gate spacer 20 which may be silicon nitride. Gate insulation layer 20 and substrate 10 are also covered with insulating layer 11 which is typically Borophosphosilicate glass (BPSG) or other suitable insulation material. Openings are formed in insulating layer 11 and electrically conductive plugs 30, 32, 34, and 36 are formed in the openings for contact with diffusion regions 14, 16, 17 of the substrate 10. P-well tie down plugs 30 are conventionally used to apply the bias voltage Vbb 92 to P-well 13 via P-well diffusion regions. Also shown are contact plugs 32 in contact with resistor 18 and contact plugs 34, 36 in contact with source/drain regions 16.

Figure 3:
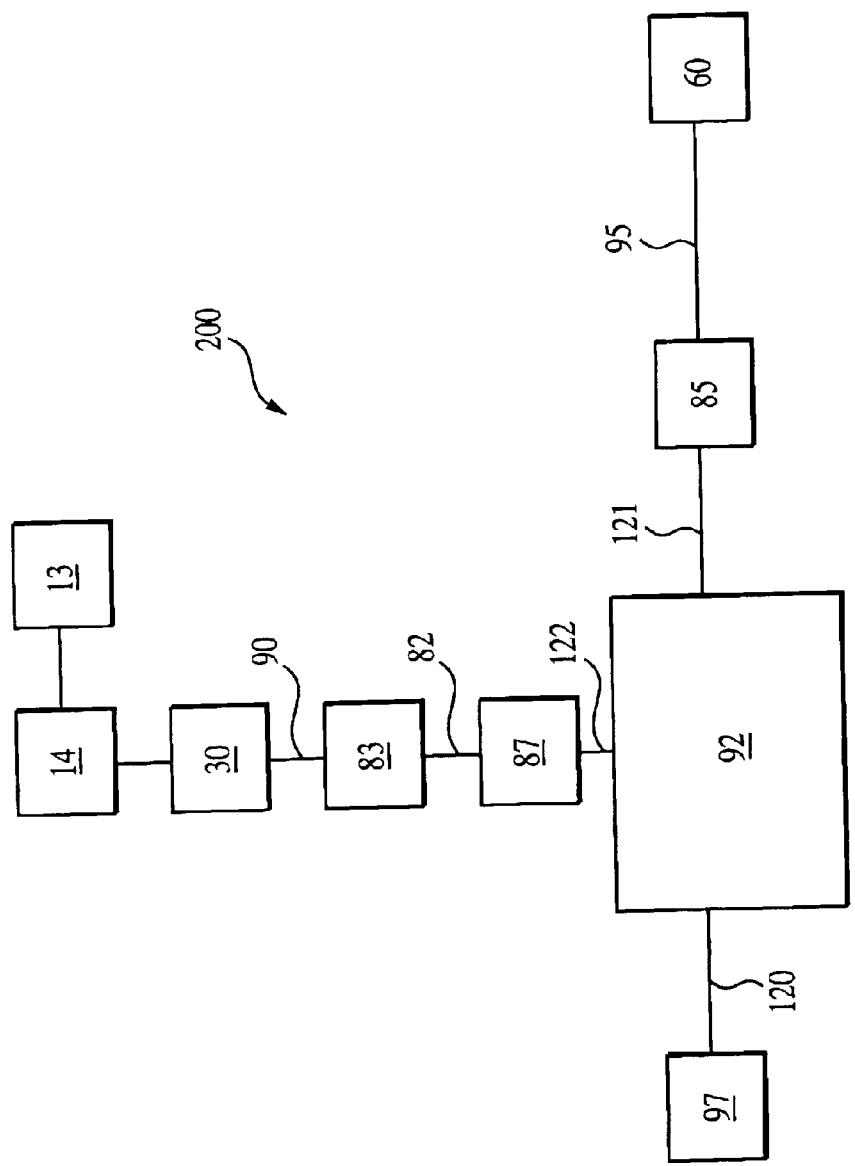
FIG. 3 is a block diagram of a semiconductor device voltage supply system with bias voltage Vbb connected to a P-well tie down and to a conductive layer used in the invention.
Figure 4:
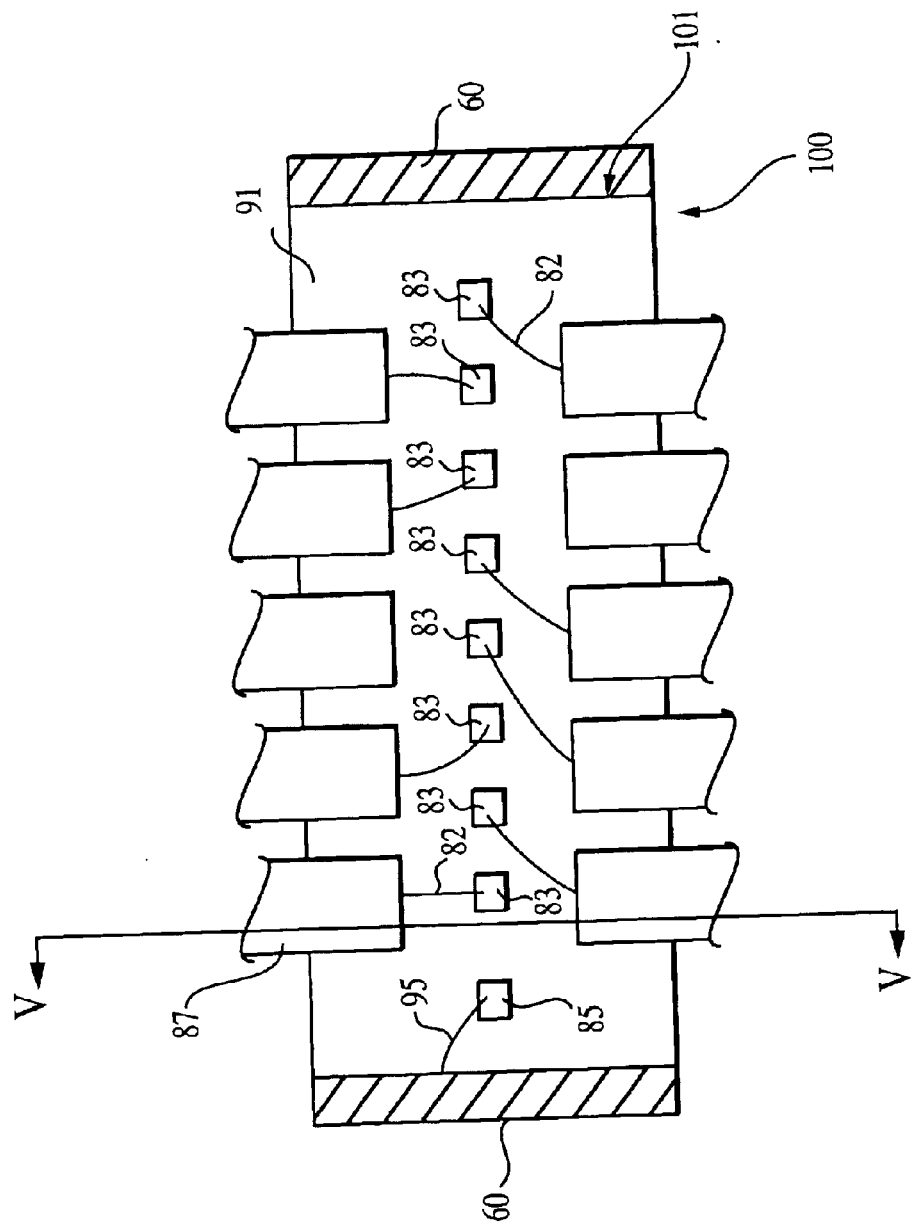
FIG. 4 is a top view of a semiconductor device with a conductive layer attached to the backside of the substrate in accordance with the invention.

P-well plugs 30 are made of a conductive material with low resistance, such as tungsten or polysilicon, and serve as ohmic contact between the bias voltage Vbb source 92 shown in FIG. 3 and P-well 13. P-well plugs 30 may be connected to bias voltage Vbb 92 via metallization layer 90, bonding pads 83, and wire bonds 82 as shown in FIG. 4. The bias voltage Vbb 92 is transferred to P-well 13 from by P-well plugs 30 and P-well diffusion regions 14. Conductive layer 60 is shown wire bonded 95 to bonding pad 85.

In a first exemplary embodiment of the invention shown in FIG. 2 the conductive layer 60 is, as noted, preferably formed as a metallic layer. The metallic layer has a thickness preferably less than or equal to 10 mil. The conductive layer 60 may be secured to the backside 81 of the substrate 10 by a conductive adhesive, such as "Ablebond 8360" manufactured by ABLESTIK Labs, Inc. The conductive layer 60 is preferably attached to the backside 81 after a fabricated wafer has been cut into individual semiconductor devices (dies) 100. The conductive layer 60 may extend beyond the length of the substrate 10, as shown at the left side of FIG. 2, to allow for attachment thereto of a bonding wire 95 which connects the conductive layer 60 to a bonding pad 85. The overall length of conductive layer 60 preferably extends no more than approximately 5 mils past substrate edge 8.

Conductive layer 60 should have a low resistivity preferably less than $1 \times 10^{-8}$ Ohm-meter. Suitable metals, metal alloys, or compounds for conductive layer 60 may be selected from at least one of the following metals: copper (Cu), silver (Ag), alloy 42, gold (Au), iron (Fe), and aluminum (Al). Conductive layer 60 removes unwanted voltage or electrical noise from substrate 10 thus reducing undesirable localized drops in the substrate bias voltage Vbb. Conductive layer 60 can be directly connected to bias voltage Vbb 92 (FIG. 3), for example, the unwanted noise signal can move vertically downward through substrate 10 to conductive layer 60 and flow through wire bond 95 to bonding pad 85. From bonding pad 85 it can flow to Vbb source 92 (FIG. 3) by known techniques.

Although FIG. 2 shows conductive layer 60 electrically connected to the bonding pad 85, benefits can also be achieved without directly connecting conductive layer 60 to bonding pad 85. In this case, conductive layer 60 attracts undesired voltages and or switching noise from localized regions of the substrate 10, such as P-well 13 and transfers it to other regions of substrate 10 thereby minimizing local Vbb voltage drops, such as at transistor gate stacks 40, 42.

In a second exemplary embodiment conductive layer 60 is formed of a curable conductive paste such as "Ablebond 8360". In this case conductive paste 60 may have the same length as the substrate 10. The conductive paste 60 may be a thermoplastic resin containing conductive particles. The conductive particles are preferably metal and may be selected from at least one of the following metals: copper (Cu), silver (Ag), gold (Au), iron (Fe), and nickel (Ni) particles. The conductive paste 60 should have a resistivity less than $1 \times 10^{-5}$ Ohm-meter, preferably less than $1 \times 10^{-7}$ Ohm-meter. The conductive paste 60 should have a thickness less than or equal to 1 mil, preferably less than approximately 0.5 mil. The cure time for the conductive paste 60 is preferably less than 15 minutes. The conductive paste 60 may be cured by heat and/or ultraviolet light. Conductive paste 60 can be applied to the substrate backside 81 of the wafer after backgrind but prior to cutting the wafer into individual semiconductor devices 100. Conductive paste 60 can be applied by spin coating, spraying, screen printing, or blade coating the paste 60.

Like the conductive metallic layer described above, if conductive paste 60 is not in direct electrical communication with bonding pad 85, it will still draw unwanted voltage or electrical noise away from substrate 10 to help stabilize the operation of the electrical elements of the device 100. Unwanted voltage noise in substrate 10 may exit the substrate 10 by moving vertically down substrate 10 to conductive paste 60 where it flows through the conductive paste 60. For example, transferred noise in conductive paste 60 may horizontally flow away from gate stacks 40, 42 and re-enter substrate 10 in the proximity of P-well diffusion regions 14. The noise can then flow from P-well diffusion regions 14 to P-well plugs 30. From the P-well plugs 30, the voltage can flow to bonding pads 83, via metallization layers 90, where it can further flow away from active areas of device 100.

In a third exemplary embodiment, conductive layer 60 is formed of a conductive polymeric film, such as "FC-262(b)" made by Hitachi Corporation. The conductive film 60 must be isotropically conductive, i.e., a three dimensional film, so that voltage is free to move in all three dimensions. A two dimensional film would not allow unwanted noise to move vertically through a two dimensional film. Conductive film 60 may be a solid resin matrix containing conductive particles. Conductive film 60 preferably has a thickness greater than approximately 1 mil and preferably less than approximately 3 mil. The conductive particles are preferably selected from at least one of the following metals: copper (Cu), silver (Ag), gold (Au), iron (Fe), and nickel (Ni). Conductive film 60 should have a resistivity less than approximately $1 \times 10^{-5}$ Ohm-meter, preferably less than $1 \times 10^{-7}$ Ohm-meter. A conductive film 60 can be applied to the wafer backside 81 after backgrind but prior to cutting the wafer into individual semiconductor devices 100. Conductive film 60 can be applied by applying pressure greater than approximately 1 MegaPascal (MPa) to the film and/or wafer, and preferably a pressure between approximately 1 to 5 (MPa) for preferably about 5 seconds or less. The conductive film 60 should be applied at a temperature greater than 175 degrees Celsius, and preferably a temperature range of approximately 175 to 400 degrees Celsius. Conductive film 60, like the conductive paste, will draw unwanted voltage or electrical noise away from substrate 10 in the manner described above with respect to the conductive paste.

In a fourth exemplary embodiment, conductive layer 60 is formed of a conductive metallic film 60. The conductive film 60 preferably should have a thickness less than or equal to approximately 1 mil and is preferably formed of conductive particles selected from the following metals: copper (Cu), silver (Ag), gold (Au), iron (Fe), and nickel (Ni). Conductive film 60 should have a resistivity less than approximately $1 \times 10^{-5}$ Ohm-meter, preferably less than $1 \times 10^{-8}$ Ohm-Meter. Conductive film 60 can be applied to the substrate backside 81 after backgrind but prior to the cutting of the wafer into individual semiconductor devices the conductive film 60 can be applied by any of the following methods or techniques: electroless plating, electrolytic plating, molecular beam epitaxy (MBE), vapor phase epitaxy (VPE), physical vapor deposition (PVD), chemical vapor deposition (CVD) and metal organic chemical vapor deposition (MOCVD). Like the conductive paste, conductive metallic film 60 draws unwanted voltage or electrical noise away from substrate 10 in the same manner as described above with respect to the conductive paste.

FIG. 3 is a block diagram of a semiconductor device voltage supply system 200 which includes a substrate bias voltage Vbb source 92. Shown are an external voltage supply Vcc 97 which supplies voltage to Vbb source 92 via electrical contact 120. Vbb source 92 is shown supplied to P-well 13 through electrical contact 122, lead finger 87, wire bond 82, bonding pad 83, metallization layer 90, P-well contact plug 30, and P-well diffusion region 14. Conductive layer 60 is shown electrically connected to Vbb 92 via wire bond 95, bonding pad 85 and electrical contact 121.

Exemplary voltage values for bias voltage Vbb 92 are −1 volts and 0 volts. If conductive layer 60 is a metallic layer it is relatively easy to electrically connect it to Vbb source 92 in the manner shown and described with reference to FIGS. 2 and 3. If the conductive layer 60 is a conductive paste, conductive polymeric film, or conductive metallic film they may also be electrically connected to Vbb source 92 through a wire or other connection. However as noted earlier, the impact of noise is still reduced even if conductive layer 60 is not in direct electrical communication to Vbb source 92.

FIG. 4 is a top view of the FIG. 2 semiconductor device 100 fabricated in accordance with the invention. Lead fingers 87 are shown secured to the top side 91 of device 100. The device 100 has a conductive layer 60 secured to the back side of the device 100 and extending past the device perimeter 101. Bonding pads 83, 85 typically are provided over an exterior surface area of the completed device 100, such as top surface 91, and may be located on the perimeter or centered on the top surface 91 as shown in FIG. 4.

After fabrication is complete the semiconductor device 100 may be secured to a lead frame (not shown) via lead fingers 87 as shown in FIG. 4. Bonding pad 85 of device 100 is shown bonded to the conductive layer 60 by a wire bond 95. Bonding pad 85 can be configured to be in electrical communication with substrate bias voltage Vbb source 92. Thus one path for removing noise from substrate 10 is for the noise to travel through the substrate 10 to conductive layer 60 to bonding pad 85 via wire bond 95. The remaining bonding pads 83 which are not in contact with conductive layer 60 are shown connected to lead fingers 87 by wire bonds 82 in accordance with the electrical requirements of the circuit design. The wire bonding can be performed with various methods and materials known in the art. Even if bonding 85 is not directly connected to Vbb source 92, the negative impact of unwanted substrate voltage or noise can still be reduced.

Figure 5:
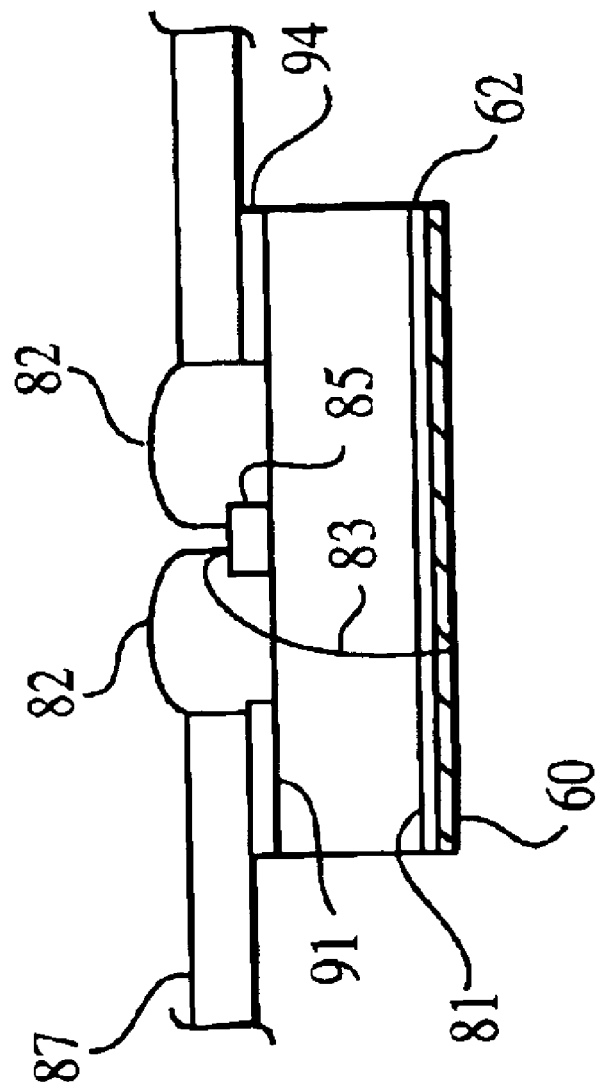
FIG. 5 is an elevation view of FIG. 4 taken at V—V.

FIG. 5 is an elevation view of FIG. 4 taken at line V—V. Conductive layer 60 is shown attached to the substrate bottom surface 81 with a conductive adhesive 62. Lead fingers 87 are shown attached to the top surface 91 of device 100 by a conductive adhesive compound 94 using well known lead on chip techniques. Also shown is bonding pad 85 which is in electrical communication with conductive layer 60 via wire bond 95.

Figure 6:
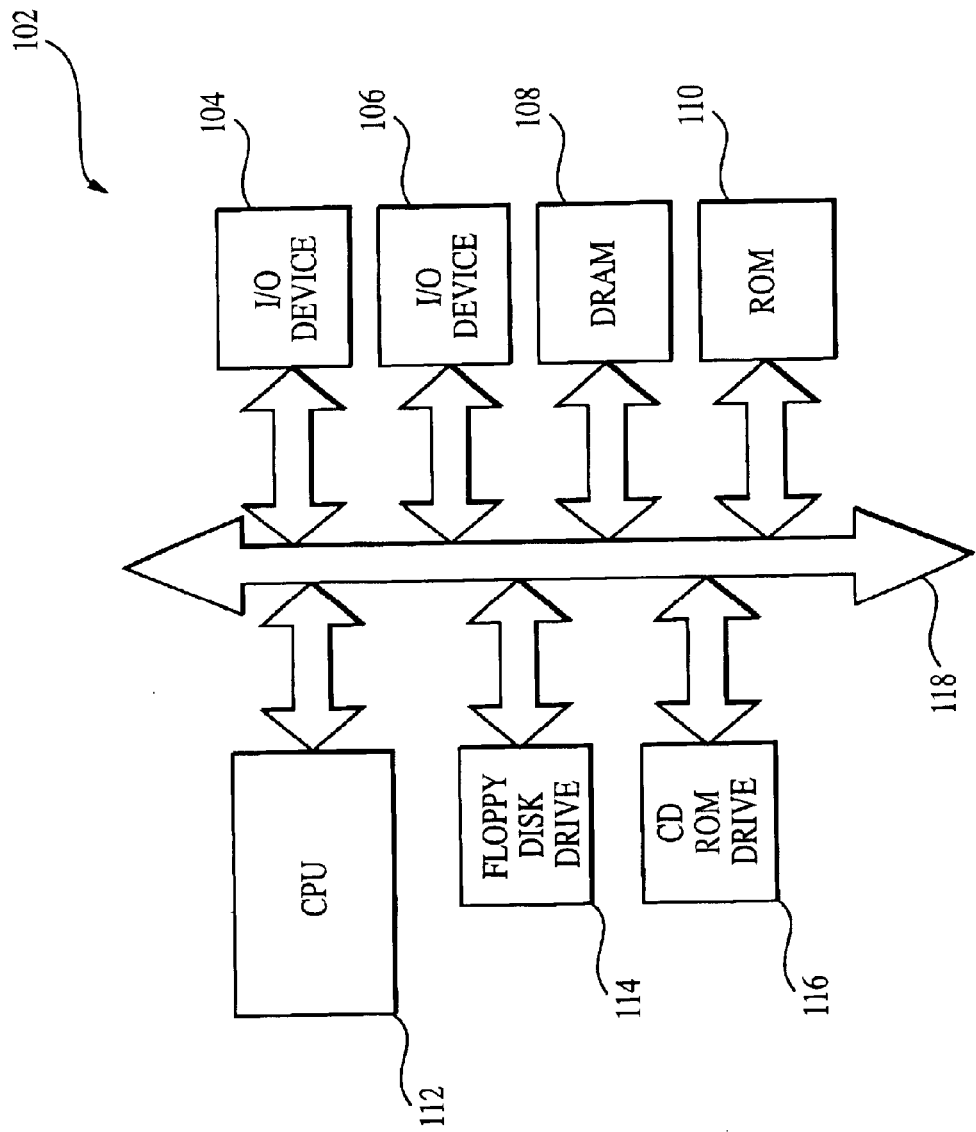
FIG. 6 is a schematic diagram of a typical processor system with which the invention may be used.

FIG. 6 illustrates a typical processor based system 102, including a DRAM memory device 108 and at least one or both of the processor and memory devices are fabricated according to the invention as described above. A processor based system, such as a computer system 102, generally comprises a central processing unit (CPU) 112, for example a microprocessor, that communicates with one or more input/output devices 104, 106 over a bus 118. The computer system 102 also includes a read only memory device (ROM) 110 and may include peripheral devices such as floppy disk drive 114 and a CD ROM drive 116 which also communicates with the CPU 112 over the bus 118. At least one of the CPU 112, ROM 110 and DRAM 108 has a conductive layer 60 attached to the backside of its substrate as described above.

Having thus described in detail preferred embodiments of the present invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A semiconductor device comprising:
   a semiconductor substrate;
   at least one electrical element circuit fabricated on an upper side of said substrate;

a plurality of bias voltage distribution regions fabricated over said upper side of said substrate for receiving a bias voltage and providing said bias voltage to said substrate; and an electrically conductive unbiased layer provided on a back side of said substrate, said layer being adapted to receive an electric charge related to unwanted voltages and electrical noise from a first region of said substrate and return an electric charge to a second different region of said substrate to maintain a uniform bias voltage throughout the substrate.

2. The semiconductor device of claim 1, wherein said electrical element comprises at least one electrical element selected from the group consisting of transistors, resistors, capacitors, electrodes, amplifiers, inverters, and gates.

3. The semiconductor device of claim 1 further comprising a plurality of conductive plugs for respectively coupling said bias voltage source to said distribution regions.

4. The semiconductor device of claim 1, wherein said conductive layer comprises a conductive metallic layer.

5. The semiconductor device of claim 4, wherein said conductive metallic layer has a thickness of less than or equal to 10 mil.

6. The semiconductor device of claim 4, wherein said conductive metallic layer is secured to the backside of said substrate with a conductive adhesive.

7. The semiconductor device of claim 4, wherein said conductive metallic layer has a resistivity less than $1\times10^{-8}$ Ohm-meter.

8. The semiconductor device of claim 4, wherein said conductive metallic layer comprises at least one material selected from the group consisting of copper (Cu), silver (Ag), alloy 42, gold (Au), iron (Fe), and aluminum (Al).

9. The semiconductor device of claim 8, wherein said conductive metallic layer is formed of at least one material selected from the group consisting of: copper (Cu), silver (Ag), alloy 42, gold (Au), iron (Fe), and aluminum (Al).

10. The semiconductor device of claim 4, wherein said metallic layer has at least one length which exceeds a length of said substrate.

11. The semiconductor device of claim 1, wherein said conductive layer comprises a cured conductive paste.

12. The semiconductor device of claim 11, wherein said conductive paste has a thickness of less than or equal to 1 mil.

13. The semiconductor device of claim 11, wherein said conductive paste has a resistivity less than $1\times10^{-5}$ Ohm-meter.

14. The semiconductor device of claim 11, wherein said conductive paste comprises a material with conductive particles therein.

15. The semiconductor device of claim 14, wherein said conductive particles comprise at least one of the group consisting of: copper (Cu), silver (Ag), gold (Au), iron (Fe), and nickel (Ni).

16. The semiconductor device of claim 1, wherein said conductive layer comprises an isotropically conductive polymeric film.

17. The semiconductor device of claim 16, wherein said conductive polymeric film has a thickness greater than 1 mil.

18. The semiconductor device of claim 16, wherein said conductive polymeric film has a resistivity less than $1\times10^{-5}$ Ohm-meter.

19. The semiconductor device of claim 16, wherein said conductive polymeric film comprises at least one conductive particle selected from the group consisting of: copper (Cu), silver (Ag), gold (Au), iron (Fe), and nickel (Ni).

20. The semiconductor device of claim 1, wherein said conductive layer comprises a conductive metallic film.

21. The semiconductor device of claim 20, wherein said conductive metallic film has a thickness of less than or equal to 1 mil.

22. The semiconductor device of claim 20, wherein said conductive metallic film has a resistivity less than $1\times10^{-5}$ Ohm-meter.

23. The semiconductor device of claim 20, wherein said conductive metallic film comprises at least one material selected from the group consisting of: copper (Cu), silver (Ag), gold (Au), iron (Fe), and nickel (Ni).

24. The semiconductor device of claim 23, wherein said conductive metallic film is formed of at least one material selected from the group consisting of: copper (Cu), silver (Ag), gold (Au), iron (Fe), and nickel (Ni).

25. The semiconductor device of claim 1, wherein said device is a memory device.

26. The semiconductor device of claim 25, wherein said memory device is a dynamic random access memory (DRAM) device.

27. The semiconductor device of claim 1, wherein said device is a logic device.

28. The semiconductor device of claim 1, wherein said device is a processor device.

29. A processor system comprising:
   a processor;
   a memory device in electrical communication with said processor;
   at least one of said memory device and said processor comprising:
      a semiconductor substrate;
      at least one electrical element fabricated on an upper side of said substrate;
      a plurality of bias voltage distribution regions fabricated over said upper side of said substrate for receiving a bias voltage and providing said bias voltage to said substrate; and
      an electrically conductive unbiased layer provided on a back side of said substrate, said layer being adapted to receive an electric charge related to unwanted voltages and electrical noise from a first region of said substrate and return an electric charge to a second different region of said substrate to maintain a uniform bias voltage throughout the substrate.

30. The system of claim 29, wherein said electrical element comprises at least one electrical element selected from the group consisting of: transistors, resistors, capacitors, electrodes, amplifiers, inverters, and gates.

31. The system of claim 29, further comprising plurality of conductive plugs for respectively coupling said bias voltage to said distribution regions.

32. The system of claim 29, wherein said conductive layer comprises a conductive metallic layer.

33. The system of claim 32, wherein said conductive metallic layer has a thickness of less than or equal to 10 mil.

34. The system of claim 32, wherein said conductive metallic layer is secured to the backside of said substrate with a conductive adhesive.

35. The system of claim 32, wherein said conductive metallic layer has a resistivity less than $1\times10^{-8}$ Ohm-meter.

36. The system of claim 32, wherein said conductive metallic layer comprises at least one material selected from the group consisting of: copper (Cu), silver (Ag), alloy 42, gold (Au), iron (Fe), and aluminum (Al).

37. The system of claim 36, wherein said conductive metallic layer is formed of at least one material selected from the group consisting of: copper (Cu), silver (Ag), alloy 42, gold (Au), iron (Fe), and aluminum (Al).

38. The system of claim 32, wherein said conductive metallic layer has a length which exceeds a length of said substrate.

39. The system of claim 29, wherein said conductive layer comprises a cured conductive paste.

40. The system of claim 39, wherein said conductive paste has a thickness of less than or equal to 1 mil.

41. The system of claim 39, wherein said conductive paste has a resistivity less than $1 \times 10^{-5}$ Ohm-meter.

42. The system of claim 39, wherein said conductive paste comprises a resin with conductive particles.

43. The system of claim 42, wherein said conductive paste comprises at least one conductive particle selected from the group consisting of: copper (Cu), silver (Ag), gold (Au), iron (Fe), and nickel (Ni).

44. The system of claim 29, wherein said conductive layer comprises an isotropically conductive polymeric film.

45. The system of claim 44, wherein said conductive polymeric film has a thickness greater than 1 mil.

46. The system of claim 44, wherein said conductive polymeric film has a resistivity less than $1 \times 10^{-5}$ Ohm-meter.

47. The system of claim 44, wherein said conductive polymeric film comprises at least one conductive particle selected from the group consisting of: copper (Cu), silver (Ag), gold (Au), iron (Fe), and nickel (Ni).

48. The system of claim 29, wherein said conductive layer comprises a conductive metallic film.

49. The system of claim 48, wherein said conductive metallic film has a thickness of less than or equal to 1 mil.

50. The system of claim 48, wherein said conductive metallic film has a resistivity less than $1 \times 10^{-5}$ Ohm-meter.

51. The system of claim 48, wherein said conductive metallic film comprises at least one material selected from the group consisting of: copper (Cu), silver (Ag), gold (Au), iron (Fe), and nickel (Ni).

52. The system of claim 51, wherein said conductive metallic film is formed of at least one material selected from the group consisting of: copper (Cu), silver (Ag), gold (Au), iron (Fe), and nickel (Ni).

53. The system of claim 29, wherein said device is a dynamic random access memory (DRAM) device.

54. The system of claim 29, wherein said device is a processor device.

55. A semiconductor device comprising:
   a semiconductor substrate;
   at least one electrical element fabricated on said substrate; and
   an electrically conductive unbiased layer provided on a back side of said substrate, said conductive layer forming an electrical path for removing unwanted voltages and electrical noise from said substrate at a first region thereof and returning said unwanted voltages and electrical noise to said substrate at a second different region thereof to maintain a uniform bias voltage throughout the substrate.

56. A semiconductor device comprising:
   a semiconductor substrate;
   at least one electrical element fabricated on an upper side of said substrate;
   a plurality of bias voltage distribution regions fabricated over said upper side of said substrate for receiving a bias voltage and providing said bias voltage to at least some portion of said substrate; and
   an electrically conductive unbiased layer provided on a backside of said substrate, said conductive layer forming an electrical path thereby equalizing unwanted voltages and electrical noise on said substrate between a first region of said substrate and a second different region of said substrate to maintain a uniform bias voltage throughout the substrate.

57. A processor system comprising:
   a processor;
   a memory device in electrical communication with said processor;
   at least one of said memory device and said processor comprising:
      a semiconductor substrate;
      at least one electrical element fabricated on an upper side of said substrate;
      a plurality of bias voltage distribution regions fabricated over said upper side of said substrate for receiving a bias voltage and providing said bias voltage to said substrate, said bias voltage distribution regions including an electrically conductive plug and a metallization layer; and
   an electrically conductive unbiased layer provided on a back side of said substrate for transferring unwanted voltages and electrical noise across said substrate to maintain a uniform bias voltage throughout the substrate.

58. A semiconductor device comprising:
   a semiconductor substrate;
   at least one electrical element fabricated on an upper side of said substrate;
   a plurality of bias voltage distribution regions fabricated over said upper side of said substrate for receiving a bias voltage and providing said bias voltage to at least some portion of said substrate, said bias voltage distribution regions including an electrically conductive plug and a metallization layer; and
   an electrically conductive unbiased layer provided on a backside of said substrate, said conductive unbiased layer forming an electrical path between a first region of said substrate and a second region of said substrate for removing unwanted voltages and electrical noise from said substrate to maintain a uniform bias voltage throughout the substrate.

* * * * *